United States Patent [19]
Lin et al.

[11] Patent Number: 5,832,000
[45] Date of Patent: Nov. 3, 1998

[54] METHOD AND APPARATUS FOR COMMUNICATING ERROR-TOLERANT MESSAGES

[75] Inventors: Jyh-Han Lin, Fort Worth, Tex.; Zhonghe Wang, Lake Worth, Fla.

[73] Assignee: Motorola, Inc., Schaumburg, Ill.

[21] Appl. No.: 819,163

[22] Filed: Mar. 17, 1997

[51] Int. Cl.⁶ .................................................. H03M 13/00
[52] U.S. Cl. .......................................... 371/37.4; 371/41
[58] Field of Search .................................... 371/37.4, 41

[56] References Cited

U.S. PATENT DOCUMENTS

| | | | |
|---|---|---|---|
| 4,654,853 | 3/1987 | Moriyama et al. | 371/41 |
| 4,835,777 | 5/1989 | DeLuca et al. | 371/69 |
| 5,426,653 | 6/1995 | Hayes et al. | 371/36 |
| 5,546,411 | 8/1996 | Leitch et al. | 371/5.5 |
| 5,600,663 | 2/1997 | Ayanoglu et al. | 371/41 |

*Primary Examiner*—Stephen M. Baker
*Attorney, Agent, or Firm*—Eduardo Guntin

[57] ABSTRACT

A communication system is used for transmitting error-tolerant messages to a selective call receiver (122). The communication system includes a transmitter circuit and a controller (112). The controller (112) applies an error-correction algorithm to an original message and repeats the application step to the by-product therefrom until a message has been generated that is sufficiently error-tolerant (506, 508). The error-tolerant message is transmitted to the selective call receiver (122), which receives the error-tolerant message using a receiver circuit. A processor (310) of the selective call receiver (122) applies an inverse error-correction algorithm to the error-tolerant message, and repeats the application step to the by-product therefrom until the original message has been reconstructed (604, 606).

10 Claims, 5 Drawing Sheets

FIG. 7

METHOD AND APPARATUS FOR COMMUNICATING ERROR-TOLERANT MESSAGES

FIELD OF THE INVENTION

This invention relates in general to radio communication systems, and particularly to radio communication systems communicating error-tolerant messages to SCR's (selective call receivers).

BACKGROUND OF THE INVENTION

The increase in demand for radio communication has given rise to new challenges not yet resolved adequately. For instance, it is now becoming common place to provide software application updates with OTA (over-the-air) programming. Because radio communication systems are susceptible to radio interference, radio communication systems have been programmed to add error-correction data to messages, thereby providing SCR's a means for reconstructing corrupted messages. Generally, the error-correction data is generated from the application of a conventional error-correction algorithm, which protects from single bit to multiple bit errors (e.g., 2 bit error correction).

This technique has proven effective for correcting errors in very short messages (e.g., 40 bytes). However, when very long messages (e.g., 4000 bytes) are transmitted to SCR's, the probability of corruption grows exponentially, and the probability that a very long message will be corrupted beyond the repair limit of the error-correction algorithm is extremely high. Although two-way communication systems provide the capability for retransmission requests, the impact of retransmission requests from a large population of SCR's requesting different portions of a message can significantly impact the efficiency of the system bandwidth.

It is therefore desirable for a radio communication system to provide a method and apparatus for transmitting error-tolerant messages to SCR's when messages are substantially long. In particular, the method and apparatus should provide an efficient means for transmitting error-tolerant messages, wherein the effective bandwidth efficiency for transmitting short and long messages is substantially better than that currently provided by prior art systems.

DESCRIPTION OF THE PREFERRED EMBODIMENT

Figure 1:
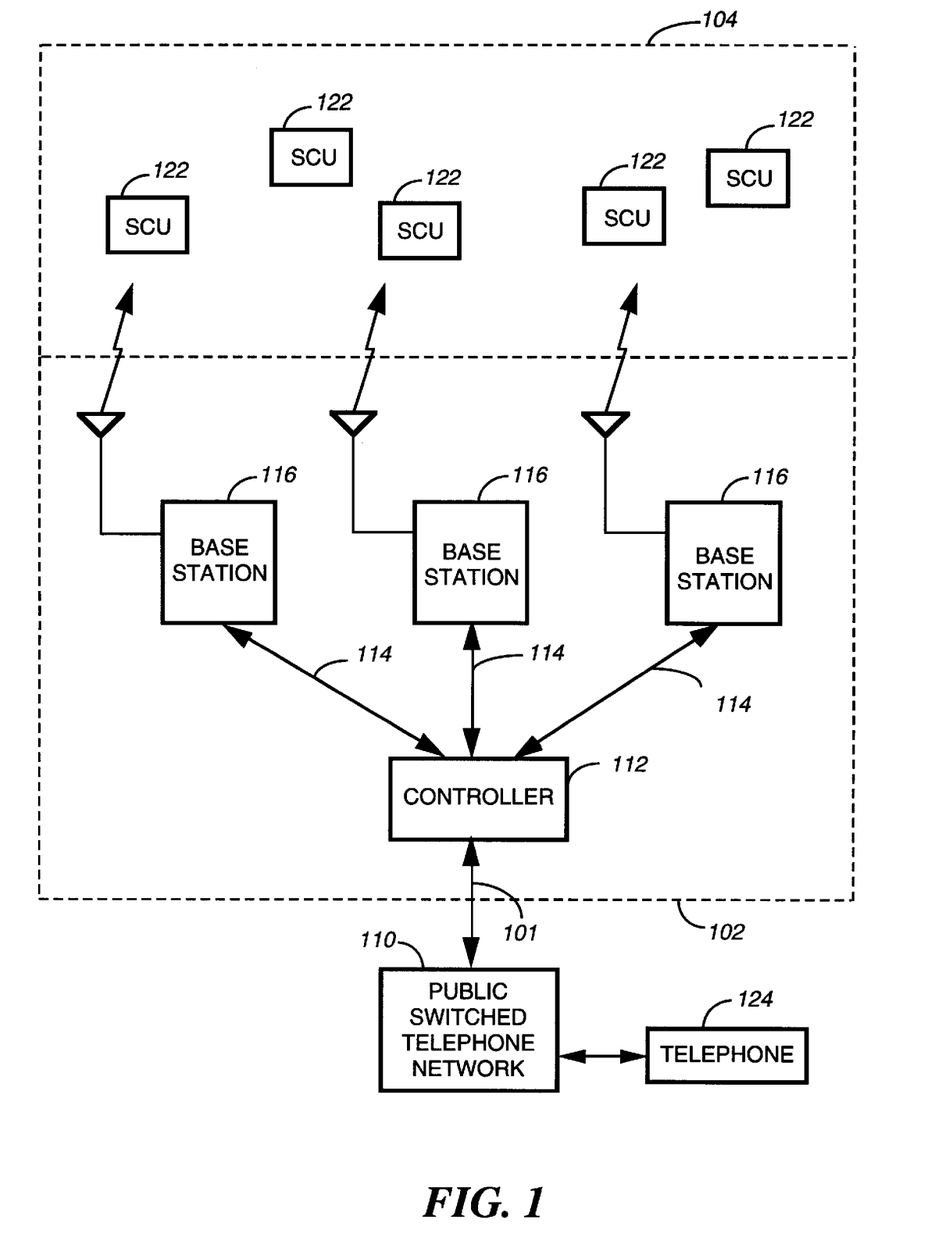
FIG. 1 is an electrical block diagram of a communication system in which the present invention can be utilized.

FIG. 1 is an electrical block diagram of a one-way radio communication system. The communication system comprises a fixed portion 102 and a portable portion 104. The fixed portion 102 includes a controller 112 for controlling operation of a plurality of base stations 116 by way of conventional communication links 114, such as microwave links. The portable portion 104 includes a plurality of SCR's (selective call receivers) 122 for receiving messages from the base stations 116 under the control of the controller 112.

The controller 112 receives messages from callers utilizing a conventional telephone 124 for communicating with a conventional PSTN (public switch telephone network) 110. The PSTN 110 relays messages to the controller 112 through a conventional telephone line 101 coupled to the controller 112. Upon receiving messages from the PSTN 110, the controller 112 processes the messages, and delivers them to the base stations 116 for transmission to designated SCR's 122.

Figure 2:
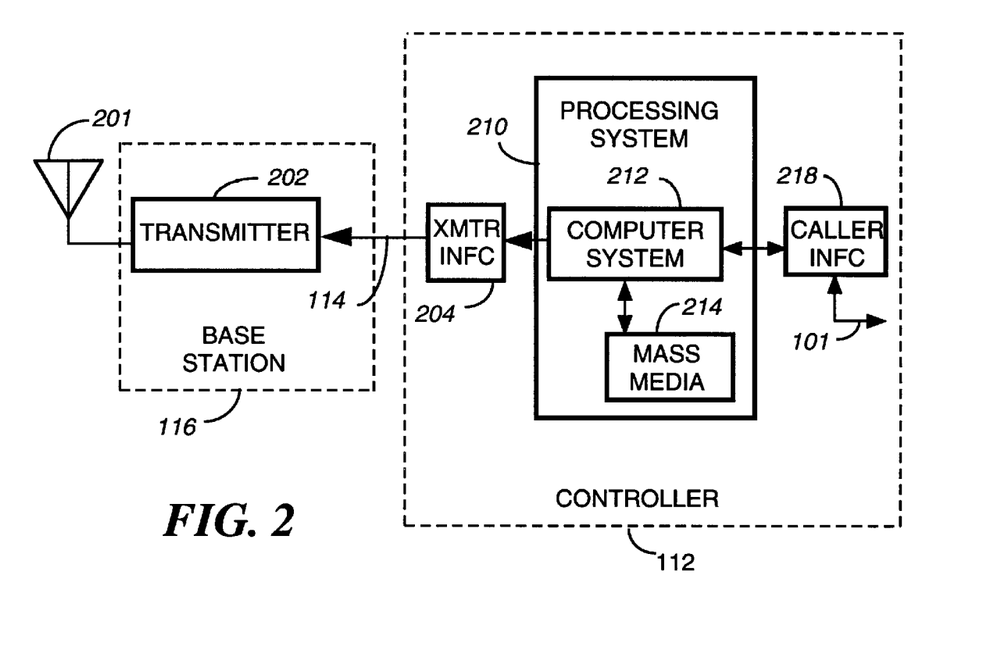
FIGS. 2 and 3 are electrical block diagrams of the fixed portion of the communication system and the selective call receiver of FIG. 1, respectively.
Figure 3:
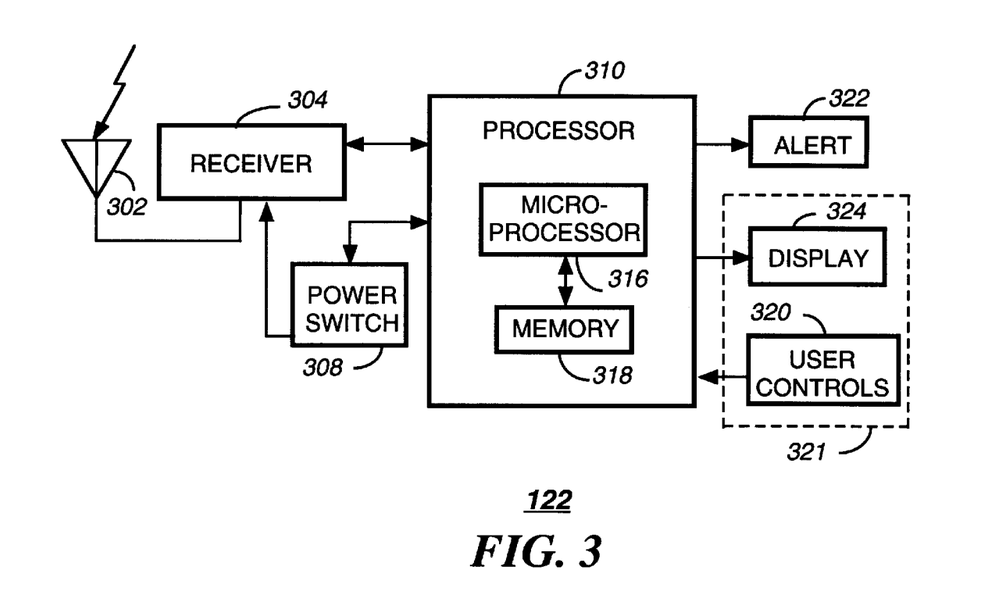

FIGS. 2 and 3 are electrical block diagrams of the fixed portion 102 and the SCR 122 of FIG. 1, respectively. The electrical block diagram of the fixed portion 102 includes the elements of the controller 112 and the base stations 116. The controller 112 comprises a conventional processing system 210 for controlling operation of the base stations 116, a conventional caller interface 218 for receiving messages from the PSTN 110, and a transmitter interface 204 for communicating messages to the base stations 116. The processing system 210 includes conventional hardware such as a computer system 212 and mass media 214 to perform the programmed operations of the controller 112. The base stations 116 comprise a conventional RF transmitter 202 coupled to an antenna 201, which together form a transmitter circuit for transmitting the messages received from the controller 112.

The SCR 122 comprises a receiver 304 coupled to an antenna 302, a power switch 308, a processor 310, an alerting device 322, and a user interface 321. The receiver 304 and antenna 302 are conventional RF elements, which together form a receiver circuit for receiving messages transmitted by the base stations 116. The power switch 308 is a conventional switch, such as a MOS (metal oxide semiconductor) switch for controlling power to the receiver 304 under the direction of the processor 310, thereby providing a battery saving function.

The processor 310 is used for controlling operation of the SCR 122. Generally, its primary function is to decode and process demodulated messages provided by the receiver 304, storing them and alerting a user of the received message. To perform this function, the processor 310 comprises a conventional microprocessor 316 coupled to a conventional memory 318 including nonvolatile and volatile memory portions, such as a ROM (read-only memory) and RAM (random-access memory). One of the uses of the memory 318 is for storing messages received from the base stations 116. Another use is for storing one or more selective call addresses utilized in identifying incoming messages belonging to the SCR 122.

Once a message has been decoded and stored in the memory 318, the processor 310 activates the alerting device 322 which generates a tactile and/or audible alert signal to the user. The user interface 321, which includes, for example, a conventional LCD display 324 and conventional user controls 320, is utilized by the user for processing the received messages. This interface provides options such as reading, deleting, and locking of messages.

Figure 4:
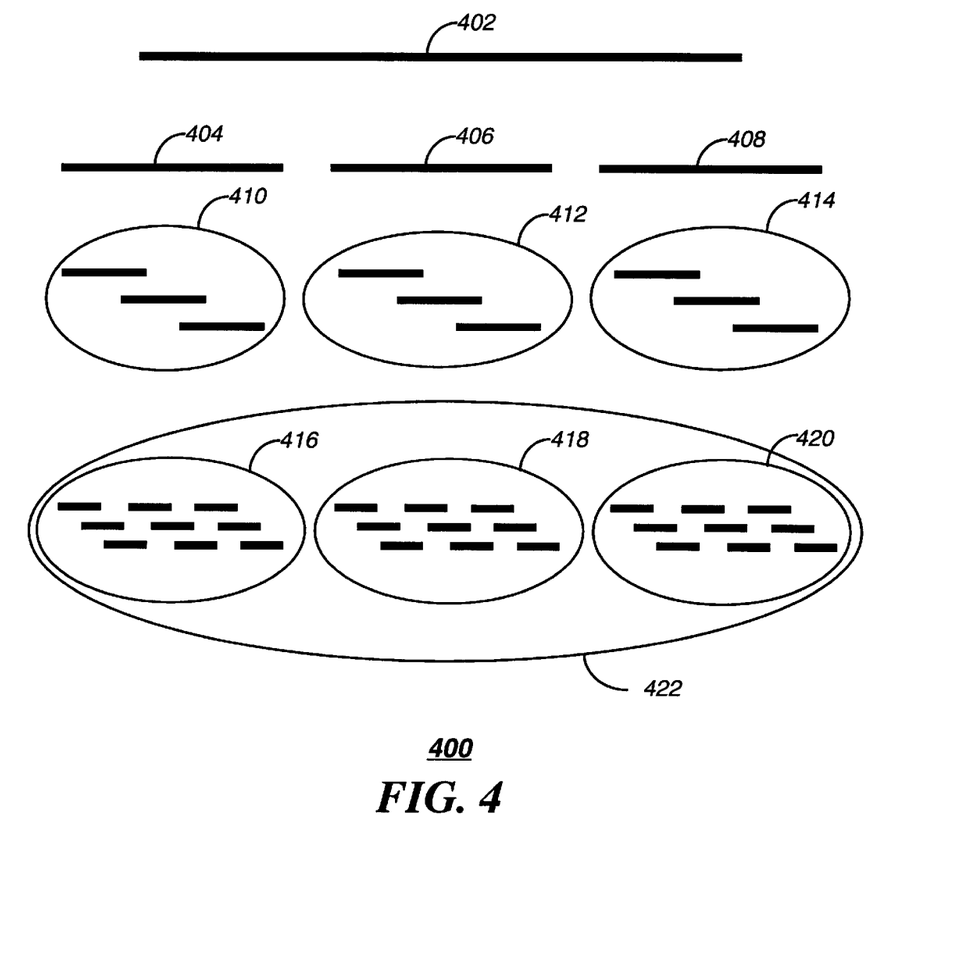
FIG. 4 illustrates how an error-correction algorithm is applied to an original message to generate an error-tolerant message according to the present invention.

To substantially eliminate the possibility of an SCR 122 receiving unrecoverable corrupt messages, the communication system preferably utilizes an error-correction algorithm for processing messages received from callers. The error-correction algorithm used is, for example, an information dispersal algorithm, well-known to those of ordinary skill in the art. The information dispersal algorithm, however, is utilized in the present invention in an unconventional manner. FIG. 4 depicts how the information dispersal algorithm is applied to an original message 402 (i.e., a message not having been processed by an error-correction algorithm) to generate an error-tolerant message 422 according to the present invention.

As shown, when an information dispersal algorithm is applied to an original message, there are three resulting by-products 404–408. Each by-product includes error-tolerant data, which adds a certain amount of redundancy to the original message, thereby providing an SCR 122 the capability of reconstructing a corrupt message, which has a fixed number of bit errors not exceeding a predetermined threshold. This first level of error-correction capability is generally acceptable for transmitting short messages (e.g., 40 bytes) to an SCR 122. However, when transmitting very long messages (e.g., 4000 bytes) this first level of error-correction capability may not be suitable for transmitting error-tolerant messages to an SCR 122.

To illustrate this point, take for example a communication environment where the bit error rate after a first application of an error correction algorithm is known to be 1 bit error for every 10,000 bits (or equivalently $10^{-4}$). The probability that 40 bytes (or 320 bits) will have at least one bit error is $3.15\% = (1 - (1 - 10^{-4})^{(320)}) \cdot 100\%$. In contrast, the probability that 4000 bytes (or 32,000 bits) will have at least one bit error is $95.92\% = (1 - (1 - 10^{-4})^{(32,000)}) \cdot 100\%$. As is evident from this example, large messages are almost certain to contain at least one bit error, and may at times contain too many bit errors making it impossible for an SCR 122 to reconstruct a corrupted message.

With significant improvements in radio communication technology and protocols, it is now conceivable that large software executables can be downloaded to SCR's 122 with over-the-air technology. Typical software applications that are likely candidates for over-the-air programming can be, for example, spread sheet programs, word processing programs, internet browsers, and, of course, upgrades to the operating system software of an SCR 122. Any one of these software applications, is expected to far exceed 4000 bytes in length. Hence the present method used by prior art systems in which an information dispersal algorithm is applied once to an original message for transmitting error-tolerant messages is not adequate for transmitting long messages in a radio communication system with a high bit-error rate.

This problem is further exacerbated when communication systems transmit large software applications to more than one SCR 122 at the same time in order to save system bandwidth. Under this situation, there is a high probability that a designated group of SCR's 122 receiving corrupted messages cannot successfully reconstruct the messages received using a first level application of the information dispersal algorithm, or any other conventional error-correction algorithm. Even in a two-way communication system, where the capability is available for the SCR's 122 to request retransmission of portions of corrupted messages that are unrecoverable, the number of retransmission requests may be so significant that bandwidth efficiency could be substantially impacted.

To resolve this problem, the present invention utilizes a conventional error-correction algorithm, such as an information dispersal algorithm, and applies the error-correction algorithm recursively to the original message and subsequent by-products therefrom until an error-tolerant message has been generated that overcomes the problems described above.

For example, assume that in a particular instance three applications of the information dispersal algorithm is sufficient to generate an error-tolerant message that overcomes the forgoing problems. As already mentioned, a first application of an information dispersal algorithm to the original message 402 generates three by-products 404–408. Applying the information dispersal algorithm to each by-product 404–408 generates a total of nine by-products grouped as three sets 410–414. Applying it again to each of the nine by-products results in a total of twenty seven by-products shown as three sets 416–420. The twenty seven by-products together provide an error-tolerant message 422 that overcomes the present bit-error rate of the communication system and any other known environmental condition.

As should be evident from the above description, the error-tolerant message 422 has substantially more redundancy than the three by-products 404–408 produced from a first application of the information dispersal algorithm. Because of this redundancy, a bit error rate, as described above, which includes a single application of an error-correction algorithm, can effectively be reduced by several orders of magnitude (e.g., from $10^{-4}$ to $10^{-6}$). It is from this substantial level of redundancy that large messages may be transmitted to a group of SCR's 122 with a very high probability that the original message 402 can be reconstructed from a corrupted error-tolerant message.

Figure 5:
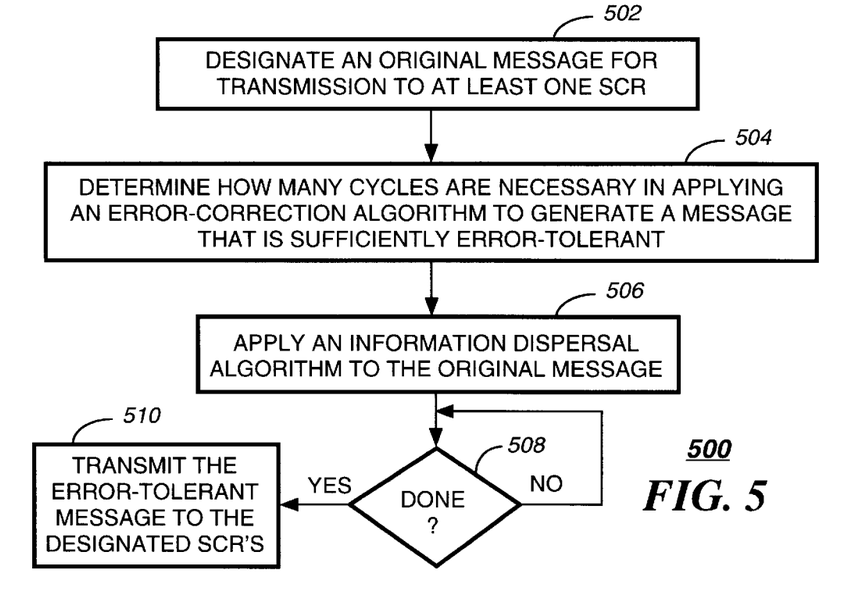
FIG. 5 is a flow chart depicting the operation of the controller of FIG. 1 according to the present invention.
Figure 7:
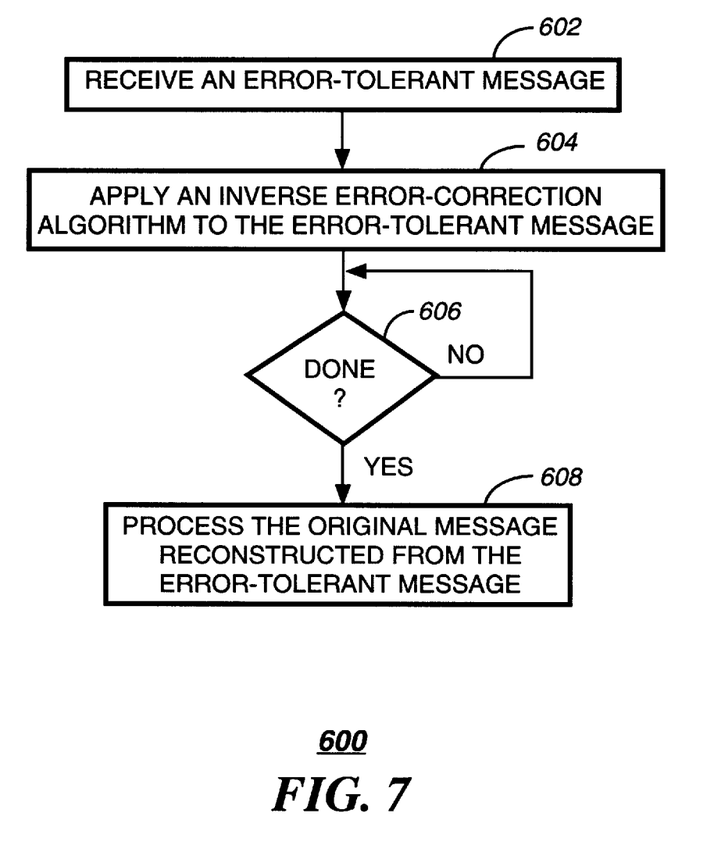
FIG. 7 is a flow chart depicting the operation of the selective call receiver of FIG. 1 according to the present invention.

FIGS. 5 and 7 are flow charts 500, 600 depicting the operation of the controller 112 and the SCR 122 of FIG. 1, respectively, according to the present invention. Instructions that correspond to the steps shown in the flow charts 500, 600 are programmed into the memories of the controller 112 and the SCR 122, respectively.

Flow chart 500 begins with step 502 where the controller 112 designates an original message for transmission to at least one SCR 122. The original message is derived from any one of a possible number of sources. For example, the original message can be derived from the communication system itself, which periodically sends software updates to a plurality of SCR's 122. Alternatively, the original message can be derived from a caller who provides a simple caller message to an SCR 122, or provides a large file transfer to one or more SCR's 122.

For any of these possible types of messages, the controller 112 proceeds to step 504 where it determines the number of cycles in which an error-correction algorithm is applied in order to transmit an error-tolerant message to one or more SCR's 122. Several factors can influence the controller's 112 decision in selecting an adequate number of cycles to apply the error-correction algorithm. For example, one factor considered is the length of the original message. For large messages, the controller 112 is likely to select more than one application of the error-correction algorithm to an original message. Alternatively, another factor considered by the controller 112 is the present environmental conditions for transmitting messages to at least one SCR 122. Such environmental conditions may include the present bit-error rate of the communication system, the number and location of SCR's 122 intended to receive the message, and known communication interference sources, e.g., adjacent channel and co-channel interference.

In steps 506 and 508, the error-correction algorithm is applied as many times as is sufficient to create an error-tolerant message comprising a plurality of groups as described for FIG. 4. Once an error-tolerant message has been created, the controller 112 proceeds to step 510, where it transmits the error-tolerant message to one or more SCR's 112. It will be appreciated that, alternatively, the controller 112 transmits each group at different times to the SCR's 112, thereby providing time diversity transmission of the error-tolerant message.

In addition to the error-tolerant message, the controller 112 can alternatively transmit reconstruction information to the SCR 122. This information can comprise any number of parameters that can be used by the SCR 122 for reconstructing the original message from an error-tolerant message. For example, the reconstruction information may include information indicating the number of times the error-correction algorithm was applied to the by-product of the application step 506. The reconstruction information may also include an inverse error-correction algorithm to be utilized by the at least one SCR 122 for reconstructing the original message from the error-tolerant message.

To illustrate the principles described in flowchart 500 of FIG. 5, an example is provided below where an information dispersal algorithm, which applies a dispersal matrix, is applied twice to an original message. The original message in this example includes the sequence of numbers: 1 2 3 4 5 6 7 8 9 10 11 12 13 14 15 16. The dispersal matrix is a predetermined matrix following the equation:

$$A = \begin{bmatrix} 1 & 0 \\ 0 & 1 \\ 1 & 1 \end{bmatrix}.$$

The original message is segmented into the following message matrix:

$$\begin{bmatrix} 1 & 3 & 5 & 7 & 9 & 11 & 13 & 15 \\ 2 & 4 & 6 & 8 & 10 & 12 & 14 & 16 \end{bmatrix}.$$

Note the columns of this matrix comprise the first two pairs of numbers in the original message, i.e., |1, 2|, |3, 4|, |5, 6|, etc. Multiplying the dispersal matrix and the message matrix, $$\begin{bmatrix} 1 & 0 \\ 0 & 1 \\ 1 & 1 \end{bmatrix} \cdot \begin{bmatrix} 1 & 3 & 5 & 7 & 9 & 11 & 13 & 15 \\ 2 & 4 & 6 & 8 & 10 & 12 & 14 & 16 \end{bmatrix} =$$

results in three groups of by-products:

$$\begin{bmatrix} 1 & 3 & 5 & 7 & 9 & 11 & 13 & 15 \\ 2 & 4 & 6 & 8 & 10 & 12 & 14 & 16 \\ 3 & 7 & 11 & 15 & 19 & 23 & 27 & 31 \end{bmatrix}.$$

Applying the information dispersal algorithm again to each by-product (after it has been segmented into another message matrix) results in the following multiplications:

$$\begin{bmatrix} 1 & 0 \\ 0 & 1 \\ 1 & 1 \end{bmatrix} \cdot \begin{bmatrix} 1 & 5 & 9 & 13 \\ 3 & 7 & 11 & 15 \end{bmatrix},$$

$$\begin{bmatrix} 1 & 0 \\ 0 & 1 \\ 1 & 1 \end{bmatrix} \cdot \begin{bmatrix} 2 & 6 & 10 & 14 \\ 4 & 8 & 12 & 16 \end{bmatrix},$$

$$\begin{bmatrix} 1 & 0 \\ 0 & 1 \\ 1 & 1 \end{bmatrix} \cdot \begin{bmatrix} 3 & 11 & 19 & 27 \\ 7 & 15 & 23 & 31 \end{bmatrix}.$$

These matrix multiplications generate three sets of nine groups of by-products:

$$\begin{bmatrix} 1 & 5 & 9 & 13 \\ 3 & 7 & 11 & 15 \\ 4 & 12 & 20 & 28 \end{bmatrix},$$

$$\begin{bmatrix} 2 & 6 & 10 & 14 \\ 4 & 8 & 12 & 16 \\ 6 & 14 & 22 & 30 \end{bmatrix},$$

$$\begin{bmatrix} 3 & 11 & 19 & 27 \\ 7 & 15 & 23 & 31 \\ 10 & 26 & 42 & 58 \end{bmatrix}.$$

This completes steps 506–508 of flowchart 500. Hence, the error-tolerant message comprises the sequence: 1 5 9 13 3 7 11 15 4 12 20 28 2 6 10 14 4 8 12 16 6 14 22 30 3 11 19 27 7 15 23 31 10 26 42 58. To provide an SCR 122 the capability of detecting a corrupt group, each group further includes error detection data (e.g., cyclic redundancy checker—CRC). It will be appreciated that, alternatively, a simple error-correction algorithm such as BCH (Bose, Chaudhuri, Hocquernghem) encoding may be used instead.

Figure 6:
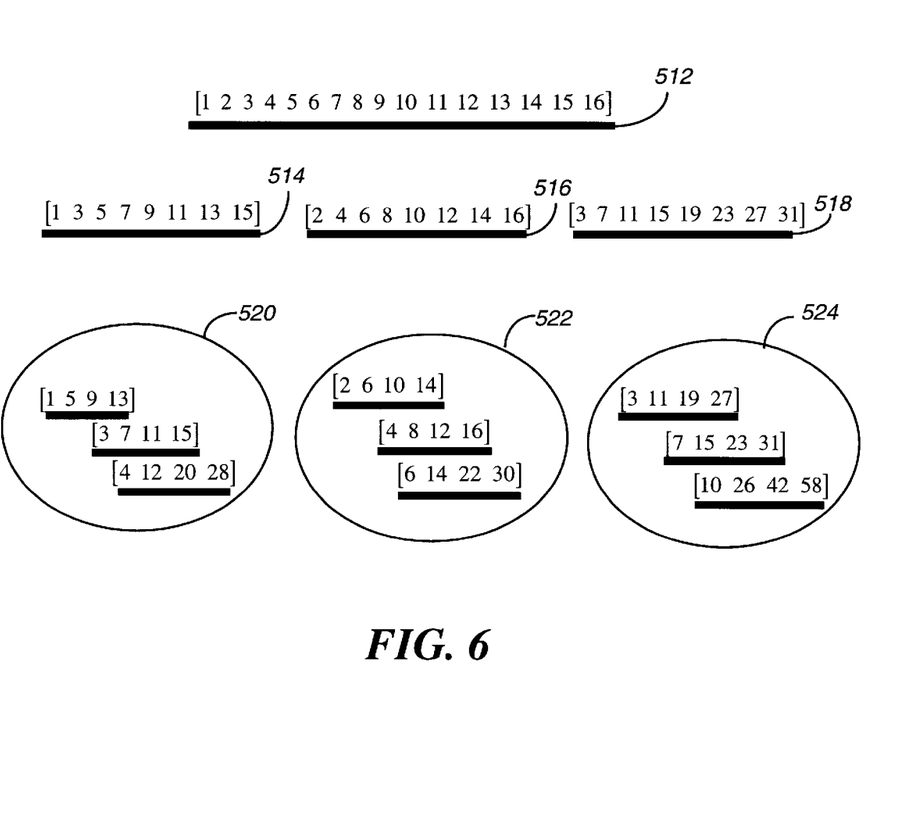
FIG. 6 illustrates the construction of an error-tolerant message according to the present invention.

FIG. 6 illustrates the construction of the groups described in the above example. As mentioned above, the information dispersal algorithm is applied to an original message 512, thereby producing three groups 514–518. When the information dispersal algorithm is again applied to each of the groups 514–518, three sets of groups 520–524, which together comprise the error-tolerant message, are created, each set comprising three groups (or nine groups in total). As had been mentioned for flow chart 500, all nine groups may be transmitted contiguously to one or more SCR's 122 or, alternatively, a selected number of the nine groups may be transmitted at different times, thereby providing time diversity transmission of the error-tolerant message.

Recalling, in the present example the original message comprised sixteen elements. The resulting error-tolerant message derived above, in contrast, comprises forty five elements (assuming the error-detection data adds an extra element per group). This is an increase of 281% over the length of the original message.

Although this may seem at first glance a significant increase in the length of the original message, it is important to recall that the intent of the present invention is to eliminate the need for retransmissions of large messages to a large group of SCR's 122. With a group of, for example, ten thousand SCR's 122 requesting retransmission of different portions, e.g., 5 bytes, of a long message of 4000 bytes, results in the retransmission of approximately 50,000 bytes. This is an increase of 1250% over the length of the original message. Hence the efficiency of the present invention is substantially better than provided by prior art systems that utilize retransmission techniques, or error-correction algorithms inadequate for transmitting error-tolerant messages to SCR's 122.

Moreover, it is worth noting that the present invention preferably applies the information dispersal algorithm recursively only to large messages. For transmitting short messages, the present invention preferably utilizes a simple error-correction algorithm such as the BCH (Bose, Chaudhuri, Hocquernghem) encoding format, which has less redundancy than that provided by the information dispersal algorithm, thereby making it more bandwidth efficient. Although the operation of the present invention in regards to the transmission of short messages is substantially the same as that of prior art systems, the overall bandwidth efficiency as a result of transmitting short and long messages according to the present invention is substantially better than prior art systems, which utilize simple BCH encoding for short and long messages alike.

The reader's attention is now directed to FIG. 7, which describes the operation of an SCR 122 according to the present invention. The flowchart 600 begins with step 602 where the receiver 304 of the SCR 122 intercepts an RF signal comprising an error-tolerant message. After demodulating the RF signal, the error-tolerant message is provided to the processor 310 for processing.

In an alternative embodiment, the RF signal also comprises reconstruction information, wherein the reconstruction information comprises a combining matrix used for reconstructing the original message, and information indicating the number of times the combining matrix is to be applied to the error-tolerant message for reconstructing the original message therefrom. In yet another embodiment, the reconstruction information can be pre-programmed into the memory 318 of the SCR 122. Under this embodiment, the communication system applies the same number of iterations of the information dispersal algorithm to the original message, and the SCR 122 uses the same combining matrix (es) for all error-tolerant messages.

To reconstruct the original message, the SCR 122 proceeds to steps 604 and 606 where it applies the combining matrix to the error-tolerant message, and repeats the application of this matrix to by-products therefrom for the number of times indicated by the reconstruction information. Once the original message has been reconstructed, the SCR 122 proceeds to step 608 where the original message is processed in a conventional manner, thereby alerting a user of an incoming message, and displaying the message upon request.

To illustrate the principles described in flowchart 600 of FIG. 7, an example is provided below where the error-tolerant message created for flowchart 500 is processed in the manner described in flowchart 600 to reconstruct the original message therefrom. Recalling, the error-tolerant message was transmitted in the following sequence: 1 5 9 13 3 7 11 15 4 12 20 28 2 6 10 14 4 8 12 16 6 14 22 30 3 11 19 27 7 15 23 31 10 26 42 58 (with error-detection data not shown).

From the reconstruction information (received from the communication system or pre-programmed into the memory 318 of the SCR 122), the SCR 122 knows that it must apply the inverse error-correction algorithm twice. Based on this finding, the SCR 122 breaks down the sequence of the error-tolerant message into three sets of nine groups of by-products:

$$\begin{bmatrix} 1 & 5 & 9 & 13 \\ 3 & 7 & 11 & 15 \\ 4 & 12 & 20 & 28 \end{bmatrix},$$

$$\begin{bmatrix} 2 & 6 & 10 & 14 \\ 4 & 8 & 12 & 16 \\ 6 & 14 & 22 & 30 \end{bmatrix},$$

$$\begin{bmatrix} 3 & 11 & 19 & 27 \\ 7 & 15 & 23 & 31 \\ 10 & 26 & 42 & 58 \end{bmatrix}.$$

In order to reconstruct the original message, only two groups from any of the three sets must be error free. That is, for the first set, any of the following combinations of groups would be sufficient to reconstruct a portion of the original message:

$$\begin{bmatrix} 1 & 5 & 9 & 13 \\ 3 & 7 & 11 & 15 \end{bmatrix},$$

$$\begin{bmatrix} 1 & 5 & 9 & 13 \\ 4 & 12 & 20 & 28 \end{bmatrix},$$

$$\begin{bmatrix} 3 & 7 & 11 & 15 \\ 4 & 12 & 20 & 28 \end{bmatrix}.$$

Assume that for this example the second matrix has more than two corrupted groups. Further assume that the only error free groups in the first and third matrixes are:

$$\begin{bmatrix} 1 & 5 & 9 & 13 \\ 3 & 7 & 11 & 15 \end{bmatrix},$$

$$\begin{bmatrix} 7 & 15 & 23 & 31 \\ 10 & 26 & 42 & 58 \end{bmatrix}.$$

The combining matrixes for each of these matrixes, respectively, are:

$$\begin{bmatrix} 1 & 0 \\ 0 & 1 \end{bmatrix},$$

$$\begin{bmatrix} -1 & 1 \\ 1 & 0 \end{bmatrix}.$$

The results after applying the combining matrixes are:

$$\begin{bmatrix} 1 & 0 \\ 0 & 1 \end{bmatrix} \cdot \begin{bmatrix} 1 & 5 & 9 & 13 \\ 3 & 7 & 11 & 15 \end{bmatrix} = \begin{bmatrix} 1 & 5 & 9 & 13 \\ 3 & 7 & 11 & 15 \end{bmatrix},$$

$$\begin{bmatrix} -1 & 1 \\ 1 & 0 \end{bmatrix} \cdot \begin{bmatrix} 7 & 15 & 23 & 31 \\ 10 & 26 & 42 & 58 \end{bmatrix} = \begin{bmatrix} 3 & 11 & 19 & 27 \\ 7 & 15 & 23 & 31 \end{bmatrix}.$$

This first level of inversion (or reconstruction) generates two matrices identical to a set of matrixes produced above for the example of flowchart 500. After regrouping elements of the above matrix, the following matrix results:

$$\begin{bmatrix} 1 & 3 & 5 & 7 & 9 & 11 & 13 & 15 \\ 3 & 7 & 11 & 15 & 19 & 23 & 27 & 31 \end{bmatrix}.$$

After again applying the combining matrix, $$\begin{bmatrix} -1 & 1 \\ 1 & 0 \end{bmatrix} \cdot \begin{bmatrix} 1 & 3 & 5 & 7 & 9 & 11 & 13 & 15 \\ 3 & 7 & 11 & 15 & 19 & 23 & 27 & 31 \end{bmatrix} =,$$

the sequence 1 2 3 4 5 6 7 8 9 10 11 12 13 14 15 16 is created, which is essentially a reconstruction of the original message.

As should be apparent from these examples, the present invention allows for a significant amount of corruption to an error-tolerant message without eliminating the capability of an SCR 122 to reconstruct an original message. Particularly, only four out of nine groups included in the error-tolerant message must be error free for reconstruction to occur. This allows for up to 55% corruption of the error-tolerant message without eliminating the capability of reconstructing the original message. This is a substantial improvement over prior art systems that simply use BCH error correction.

Moreover, by utilizing the present invention, retransmission of portions of a long message, which cannot be reconstructed by SCR's 122, is eliminated. Under high bit error rates (e.g., $10^{-4}$), prior art systems effectively require a substantial number of retransmissions of long messages (e.g., 12.5 times—see example provided above for a 4000 byte message). Lastly, the present invention is flexible. That is, if short messages are to be transmitted, simple BCH encoding can be used rather than a recursive application of, for example, an information dispersal algorithm. Hence, the effective bandwidth efficiency of the present invention is better than prior art systems that utilize, e.g., BCH encoding for short and long messages alike.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A method in a communication system for transmitting error-tolerant messages to at least one selective call receiver, comprising the steps of:

applying an error-correction algorithm to an original message, thereby generating a by-product, wherein the error-correction algorithm is an information dispersal algorithm, which applies a dispersal matrix to the original message;

repeating the foregoing step to the by-product therefrom until a message has been generated that is sufficiently error-tolerant; and transmitting to the at least one selective call receiver the message.

2. The method as recited in claim 1, wherein the number of times the error-correction algorithm is applied to the by-product of the application step is based on the length of the original message.

3. The method as recited in claim 1, wherein the number of times the error-correction algorithm is applied to the by-product of the application step is based on environmental conditions present in the communication system for transmitting messages to the at least one selective call receiver.

4. The method as recited in claim 1, wherein the transmitting step further comprises the step of transmitting information to the at least one selective call receiver indicating the number of times the error-correction algorithm was applied to the by-product of the application step.

5. A method in a communication system for transmitting error-tolerant messages to at least one selective call receiver, comprising the steps of:

applying an error-correction algorithm to an original message, thereby generating a by-product;

repeating the foregoing step to the by-product therefrom until a message has been generated that is sufficiently error-tolerant; and transmitting to the at least one selective call receiver the message and reconstruction information, wherein the reconstruction information comprises a combining matrix used for reconstructing the original message, and information indicating the number of times the combining matrix is to be applied to the message for reconstructing the original message therefrom.

6. A method in a selective call receiver for reconstructing an original message embedded in an error-tolerant message, comprising the steps of:

receiving an error-tolerant message transmitted by a communication system;

applying an inverse error-correction algorithm to the error-tolerant message, thereby generating a by-product wherein the inverse error-correction algorithm is an information dispersal algorithm, which applies a combining matrix for reconstructing the original message and repeating the application step to the by-product therefrom until the original message has been reconstructed.

7. The method as recited in claim 6, further includes the step of receiving information transmitted by the communication system indicating the number of times the inverse error-correction algorithm is to be applied.

8. A method in a selective call receiver for reconstructing an original message embedded in an error-tolerant message, comprising the steps of:

receiving reconstruction information, and an error-tolerant message transmitted by a communication system, wherein the reconstruction information comprises a combining matrix used for reconstructing the original message, and information indicating the number of times the combining matrix is to be applied to the error-tolerant message for reconstructing the original message therefrom;

applying the combining matrix to the error-tolerant message, thereby generating a by-product; and repeating the application step to the by-product therefrom for the number of times indicated by the reconstruction information.

9. A communication system for transmitting error-tolerant messages to at least one selective call receiver, comprising:

a transmitter circuit; and a controller coupled to the transmitter circuit, the controller adapted to:

apply an error-correction algorithm to an original message, thereby generating a by-product wherein the error-correction algorithm is an information dispersal algorithm which applies a dispersal matrix to the original message;

repeat the application step to the by-product therefrom until a message has been generated that is sufficiently error-tolerant; and cause the transmitter circuit to transmit to the at least one selective call receiver the message.

10. A selective call receiver for reconstructing an original message embedded in an error-tolerant message, comprising:

a receiver circuit; and a processor coupled to the receiver circuit, the processor adapted to:

receive from the receiver circuit reconstruction information, and an error-tolerant message transmitted by a communication system, wherein the reconstruction information comprises a combining matrix used for reconstructing the original message, and information indicating the number of times the combining matrix is to be applied to the error-tolerant message for reconstructing the original message therefrom;

apply the combining matrix to the error-tolerant message, thereby generating a by-product; and repeat the application step to the by-product therefrom for the number of times indicated by the reconstruction information.

* * * * *